United States Patent
Joo et al.

(10) Patent No.: US 7,294,876 B2
(45) Date of Patent: Nov. 13, 2007

(54) FERAM DEVICE AND METHOD FOR MANUFACTURING THE SAME

(75) Inventors: Heung-Jin Joo, Gyeonggi-do (KR); Bon-Jae Koo, Gyeonggi-do (KR); Jung-Hoon Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 11/325,633

(22) Filed: Jan. 3, 2006

(65) Prior Publication Data
US 2006/0157763 A1 Jul. 20, 2006

(30) Foreign Application Priority Data
Jan. 3, 2005 (KR) .................. 10-2005-0000276

(51) Int. Cl.
*H01L 29/76* (2006.01)
*H01L 21/8242* (2006.01)
(52) U.S. Cl. .............. 257/295; 257/296; 257/306; 257/E27.086; 438/253; 438/396
(58) Field of Classification Search ............ 257/295, 257/296, 306, 253, 751, E27.086; 438/253, 438/396, 627
See application file for complete search history.

(56) References Cited

U.S. PATENT DOCUMENTS

| | | | |
|---|---|---|---|
| 6,351,006 B1 | 2/2002 | Yamakawa et al. | |
| 6,423,592 B1 * | 7/2002 | Sun | 438/240 |
| 6,674,633 B2 | 1/2004 | Horii et al. | |
| 7,105,400 B2 * | 9/2006 | Imai et al. | 438/238 |
| 7,151,289 B2 * | 12/2006 | Ito | 257/295 |
| 2001/0000923 A1 * | 5/2001 | Takemura | 257/532 |
| 2005/0118795 A1 * | 6/2005 | Hidaka et al. | 438/593 |

FOREIGN PATENT DOCUMENTS

| | | |
|---|---|---|
| KR | 2001-0058494 | 7/2001 |
| KR | 2004-0059391 | 7/2004 |

OTHER PUBLICATIONS

English language abstract of Korean Publication No. 2005-0007653.
English language abstract of Japanese Publication No. 08-315586.

* cited by examiner

*Primary Examiner*—T. N. Quach
(74) *Attorney, Agent, or Firm*—Marger Johnson & McCollom, P.C.

(57) ABSTRACT

An embodiment of the FeRAM includes a ferroelectric capacitor including a bottom electrode, a ferroelectric layer, and a top electrode. Strontium ruthenium oxide is formed between the bottom electrode and the ferroelectric layer and between the ferroelectric layer and the top electrode. A diffusion barrier layer including strontium ruthenium oxide and iridium is formed between the top electrode and a direct cell contact plug coupled to a plate line interconnecting top electrodes of ferroelectric capacitors. Thus, diffusion of nitrogen or metallic materials produced in subsequent processes is suppressed to prevent degradation of the ferroelectric layer.

20 Claims, 6 Drawing Sheets

FERAM DEVICE AND METHOD FOR MANUFACTURING THE SAME

PRIORITY STATEMENT

This application claims priority of Korean Patent Application No. 2005-00276, filed on Jan. 3, 2005 in the Korean Intellectual Property Office, the disclosure of which is incorporated herein in its entirety by reference.

BACKGROUND OF THE INVENTION

1. Field of the Invention

The present invention relates to a semiconductor memory technology and, more particularly, to a semiconductor device such as a ferroelectric memory (FeRAM) device and a method for manufacturing the same.

2. Description of Related Art

Ferroelectric random access memory (FeRAM) devices are memory devices using the orientation of an electric dipole induced by a high-frequency alternating current (AC) field. FeRAM devices have a capacitor made of a ferroelectric substance where two poles, established by applying electricity, remain even when the electricity is cut off. Generally, ferroelectric substances are, for example, $Pb(Zr_xTi_{1-x})O_3$ (hereinafter referred to as "PZT") and $SrBi_2Ta_2O_9$ (hereinafter referred to as "SBT").

In recent years, many efforts have been made to decrease the number of mask layers in forming high-capacitance FeRAM devices to enhance price competitiveness. FIG. 1 illustrates an FeRAM where a direct cell contact is formed between a plate line interconnecting capacitors and a top electrode of a capacitor to decrease the number of mask layers.

As illustrated in FIG. 1, an oxygen barrier layer 13, a bottom electrode 15, a ferroelectric layer 17, and a top electrode 19 are sequentially stacked on a first insulation layer 11 formed on a substrate 10 to constitute a capacitor. A shield layer 21 is formed on the capacitor. Since the shield layer 21 prevents other materials from penetrating the capacitor, the characteristics of the capacitor are not degraded. A second insulation layer 27 is formed on the shield layer 21. Another shield layer 23 and another insulation layer 24 may be formed on the second insulation layer 27. A portion of the second insulation layer 27 is removed to expose a part of the top electrode 19 of the capacitor, thereby forming a direct cell contact hole. The direct cell contact hole is formed by additionally removing a portion of the shield layer 21, formed on the top electrode 19, at the same time. Although not shown in the figure, a titanium nitride (TiN) layer is formed as a diffusion barrier and a metal such as, for example, tungsten (W) is deposited and an etch-back process is carried out to form a contact plug 29. A metal is deposited and patterned to form a plate line 25 interconnecting top electrodes of ferroelectric capacitors.

As described above, a shield layer formed to shield a capacitor structure is partially removed when a direct cell contact is formed. Accordingly, there is a region of direct contact between the direct cell contact and the top electrode. In order to complement the direct contact region, a titanium nitride layer is generally formed as a diffusion barrier. However, titanium nitride has poor characteristics as a diffusion barrier for aluminum, which is used in the formation of a plate line. Moreover, nitrogen produced in the process of forming the contact plug or the plate line may diffuse into the ferroelectric substance through the direct contact region and degrade the capacitor.

Embodiments of the invention address these and other disadvantages of the conventional art.

SUMMARY

Embodiments of the present invention are directed to a ferroelectric random access memory (FeRAM) device having a diffusion barrier layer including strontium ruthenium oxide and iridium to prevent nitrogen from diffusing into ferroelectric materials and a method for manufacturing the FeRAM device.

In one embodiment of the present invention, the FeRAM device includes a ferroelectric capacitor with a bottom electrode, a ferroelectric layer, and a top layer. The FeRAM device further includes an insulation layer formed on the ferroelectric capacitor with a direct cell contact hole formed in it to expose the top electrode of the capacitor. A diffusion barrier layer including strontium ruthenium oxide and iridium is further formed along the exposed top electrode and sidewalls of the direct cell contact hole. A plug material is formed in the remaining unfilled portion of the direct cell contact hole and a plate line is formed on the plug material to interconnect the top electrode with the top electrodes of other ferroelectric capacitors. Since the diffusion barrier layer prevents nitrogen produced when a contact plug or plate line is formed at the direct cell contact hole from diffusing through the top electrode of the capacitor, the ferroelectric layer of the capacitor is not degraded.

DETAILED DESCRIPTION

Figure 1:
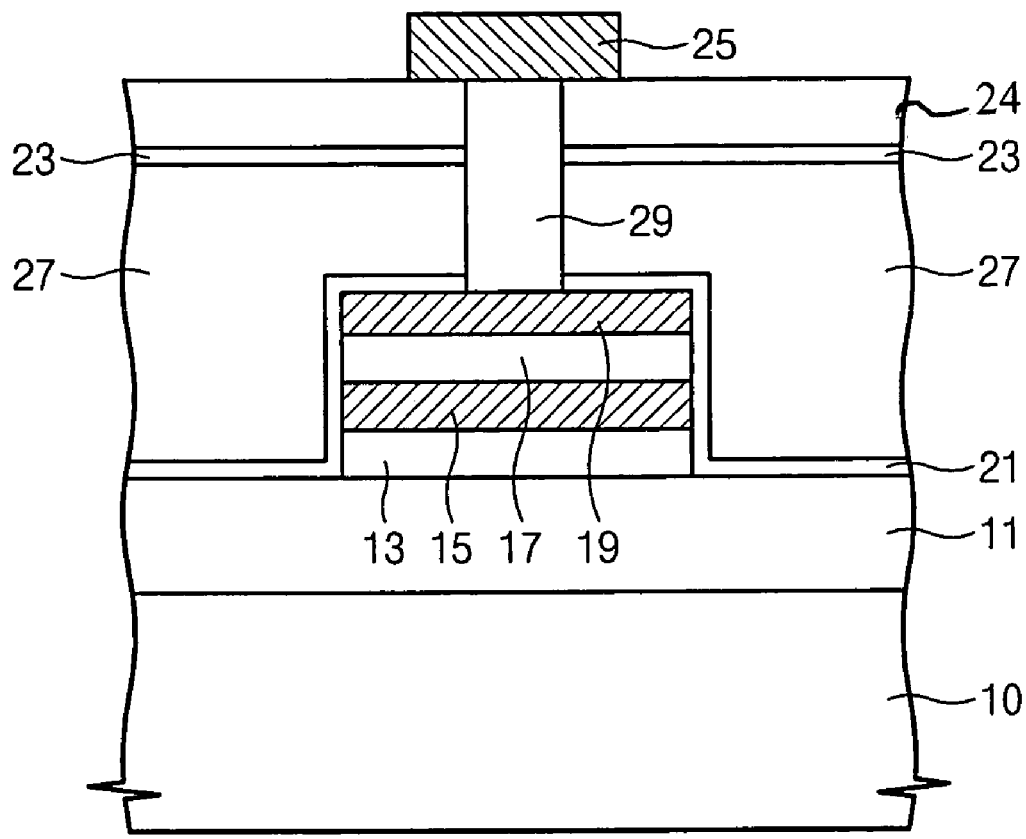
FIG. 1 is a cross-sectional view of a conventional FeRAM device.

The present invention will now be described more fully hereinafter with reference to the accompanying drawings, in which embodiments of the present invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

FIG. 2 through FIG. 4C are cross-sectional views of an FeRAM device illustrating a method for manufacturing the FeRAM device according to an embodiment of the present invention.

Although not shown in the figures, device isolation layers are disposed in predetermined regions of a semiconductor substrate 100 such as a silicon substrate to define active regions. Transistors are disposed at active regions between the device isolation layers. Each of the transistors includes a gate electrode crossing an active region, and a source region and a drain region formed in active regions adjacent to opposite sides of the gate electrode. A bitline contacts the source region of the respective transistors, electrically interconnecting peripheral circuits or adjacent transistors.

Figure 2:
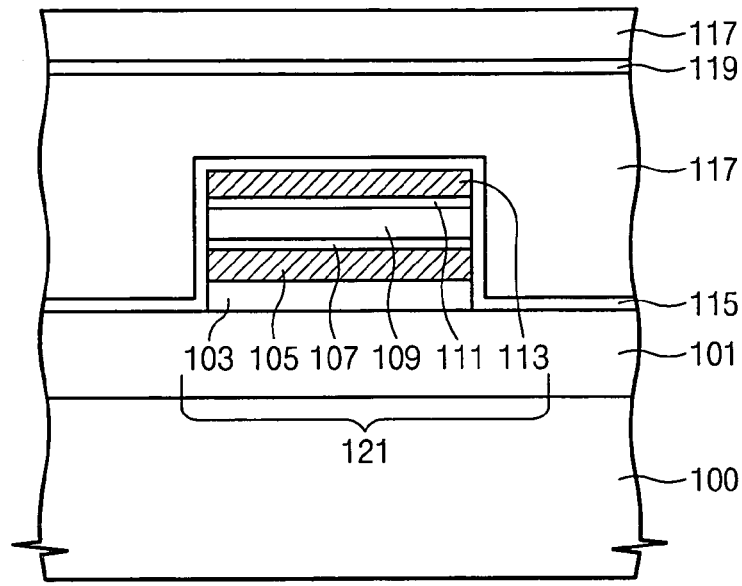
FIG. 2 through FIG. 4C are cross-sectional views of an FeRAM device illustrating a method for manufacturing the FeRAM device according to an embodiment of the present invention.

As illustrated in FIG. 2, a first insulation layer 101 is disposed on the substrate 100. A capacitor 121 is disposed on the first insulation layer 101. The capacitor 121 includes an oxygen barrier layer 103, a bottom electrode 105, a ferroelectric layer 109, and a top electrode 113, all of which are sequentially stacked. Although not shown in the figure, buried plugs are disposed to connect the drain region to the bottom electrode 105 through the first insulation layer 101.

A first strontium ruthenium oxide ($SrRuO_3$) layer 107 is formed between the bottom electrode 105 and the ferroelectric layer 109 and a second strontium ruthenium oxide layer 111 is formed between the ferroelectric layer 109 and the top electrode 113. Alternatively, iridium oxide ($IrO_x$) may be used instead of the strontium ruthenium oxide. The oxygen barrier layer 103 is made of titanium aluminum nitride (TiAlN) and deposited using, for example, chemical vapor deposition (CVD) or physical vapor deposition (PVD).

The bottom electrode 105 may typically be made of platinum (Pt) or iridium (Ir). The first strontium ruthenium oxide layer 107 is formed on the bottom electrode 105 in order to improve the coupling characteristic of the electrode material and the material used to form the ferroelectric layer 109. The PZT or SBT used to form the ferroelectric layer 109 typically includes oxygen atoms. Thus, the coupling characteristic between PZT or SBT and a metallic material is more enhanced when strontium ruthenium oxide is formed between the PZT or SBT and the metallic material than when the PZT or SBT is directly coupled with an underlying or overlying metallic material. In particular, formation of the strontium ruthenium oxide prevents nitrogen or metallic materials produced in subsequent processes from re-diffusing into the ferroelectric layer 109. For the same reason, iridium oxide may be formed instead of the strontium ruthenium oxide, as mentioned above.

The ferroelectric layer 109 is made of PZT or SBT and is formed using, for example, spin coating, liquid source mist chemical deposition (LSMCD), chemical vapor deposition (CVD), physical vapor deposition (PVD), or other suitable thin film formation techniques. The top electrode 113 is disposed on the second strontium ruthenium oxide layer 111. Similar to the bottom electrode 105, the top electrode 113 is made of platinum (Pt) or iridium (Ir).

A shield layer 115 is formed on the capacitor 121. The shield layer 115 may be made of aluminum oxide ($Al_2O_3$). Due to the shield layer 115, nitrogen or metallic materials do not diffuse into the ferroelectric layer 109, thus preventing degradation of properties of the capacitor. The shield layer 115 may be deposited using atomic layer deposition (ALD). Since ALD results in a layer which is thinner and harder than CVD or PVD, the shielding function of the shield layer 115 may be improved. A second insulation layer 117 is formed on the shield layer 115. Another shield layer 119 and another insulation layer 118 may be formed on the second insulation layer 117 in order to prevent degradation of properties of the capacitor.

Figure 3:
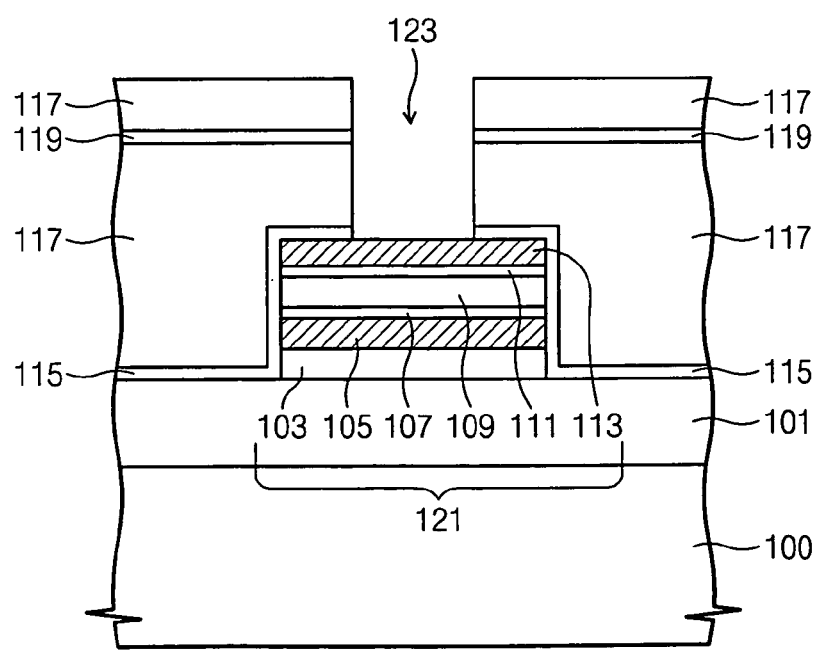

Referring to FIG. 3, the second insulation layer 117 and shield layer 115 are removed to partially expose the top electrode 113, forming a direct cell contact hole 123. If a process of forming a tungsten plug is directly formed in the direct cell contact hole 123, nitrogen or metallic materials may diffuse into a direct contact region of the direct cell contact hole 123 and the top electrode 113. Therefore, in this embodiment, strontium ruthenium oxide and iridium are formed along the bottom and sidewalls of the direct cell contact hole 123 in order to prevent nitrogen or metallic materials from diffusing through the direct cell contact.

Figure 4A:
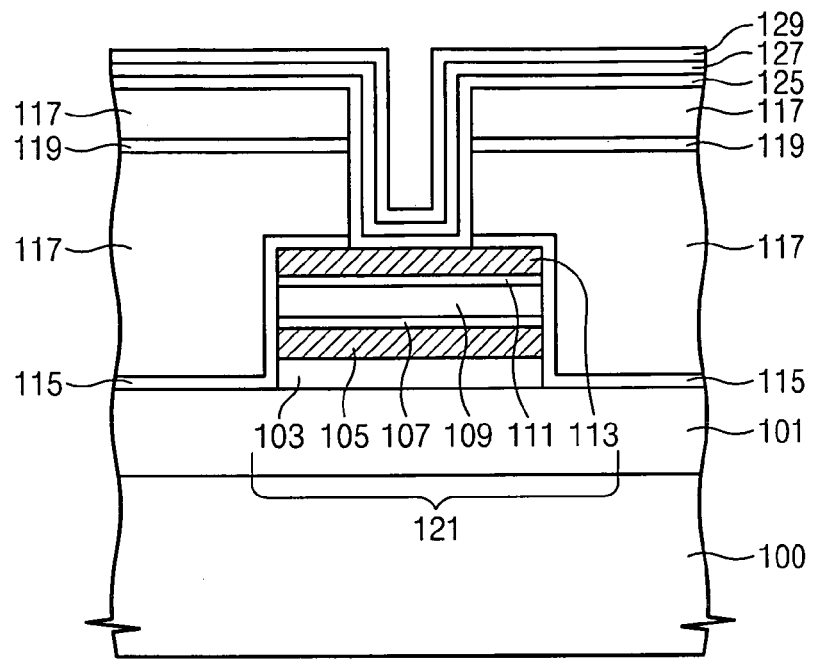

Referring to FIG. 4A, a strontium ruthenium oxide layer 125 may be conformally formed over the second insulation layer 117 and the exposed top electrode 113. An iridium layer 127 is formed on the strontium ruthenium oxide layer 125. The strontium ruthenium oxide layer 125 and the iridium layer 127 may be deposited using sputtering, for example, CVD or ALD. A metal diffusion barrier layer 129 may be formed on the iridium layer 127. The metal diffusion barrier layer 129 may be made from titanium nitride (TiN), tantalum silicon nitride (TaSiN), titanium silicon nitride (TiSiN), or a similar material.

Figure 4B:
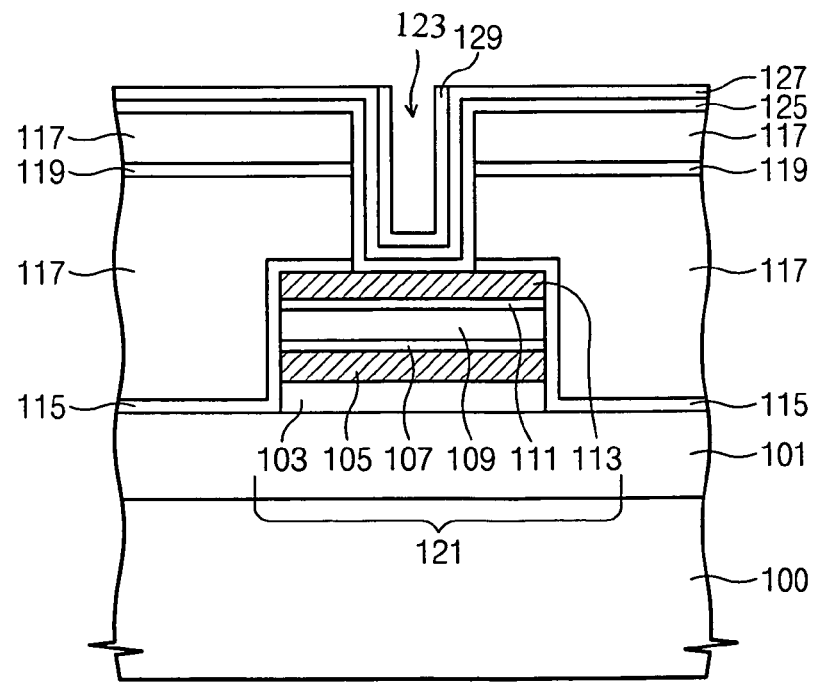
Figure 4C:
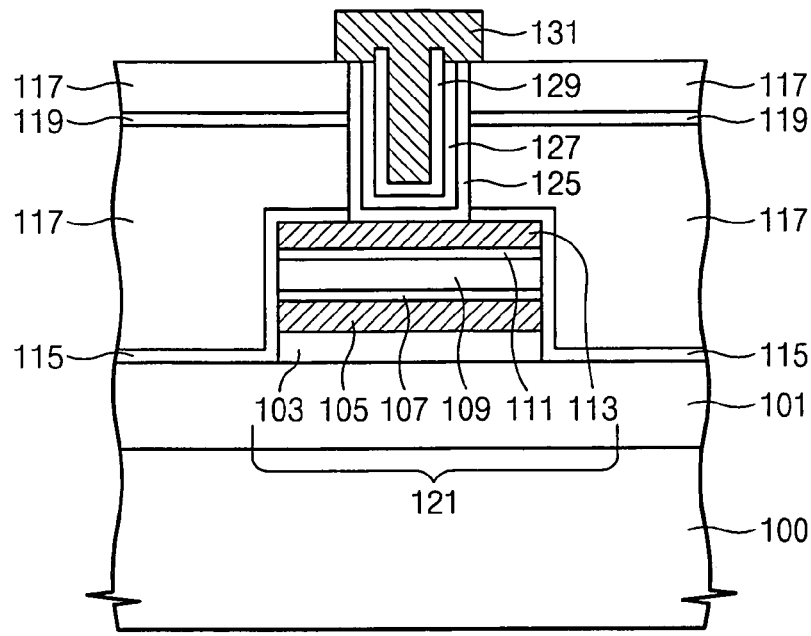

Referring to FIG. 4B, the metal diffusion barrier layer 129 is planarized, e.g., chemically mechanically polished. Using the metal diffusion barrier layer 129 as a mask, an etch-back process is carried out to allow the strontium ruthenium oxide layer 125, the iridium layer 127, and the metal diffusion barrier layer 129 to remain within a direct cell contact hole 123. Referring to FIG. 4C, a metal layer is stacked on the unfilled portion of the direct cell contact hole 123 and patterned to form a plate line 131. Preferably, the unfilled portion of the direct cell contact hole 123 is filled with a tungsten layer and the plate line 131 is formed thereon. Alternatively, only aluminum may be stacked using reflow or CVD after a sputtering process is performed for the remaining portion of the direct cell contact hole 123 and the second insulation layer 117.

Figure 5A:
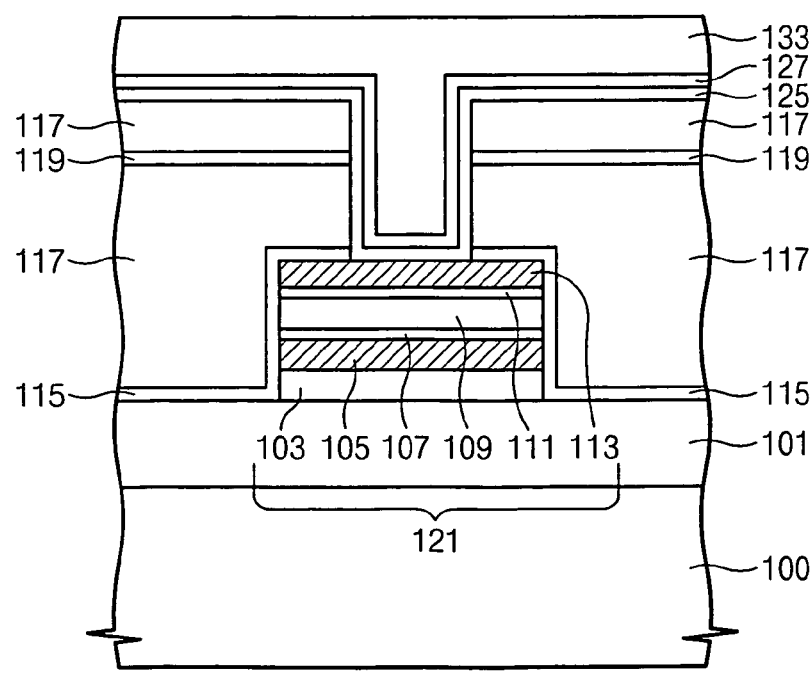
FIG. 5A through FIG. 5C are cross-sectional views of an FeRAM device illustrating a method for manufacturing the FeRAM device according to another embodiment of the present invention.
Figure 5B:
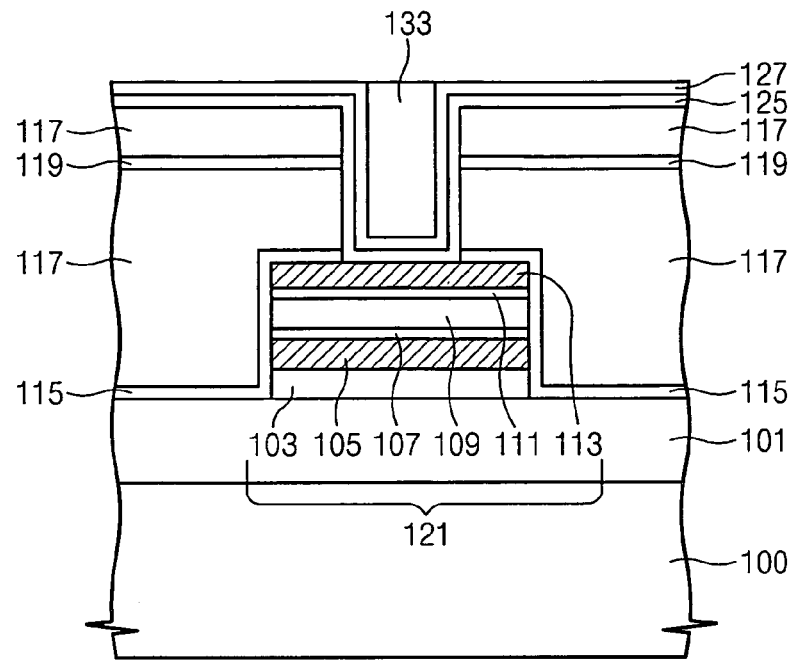
Figure 5C:
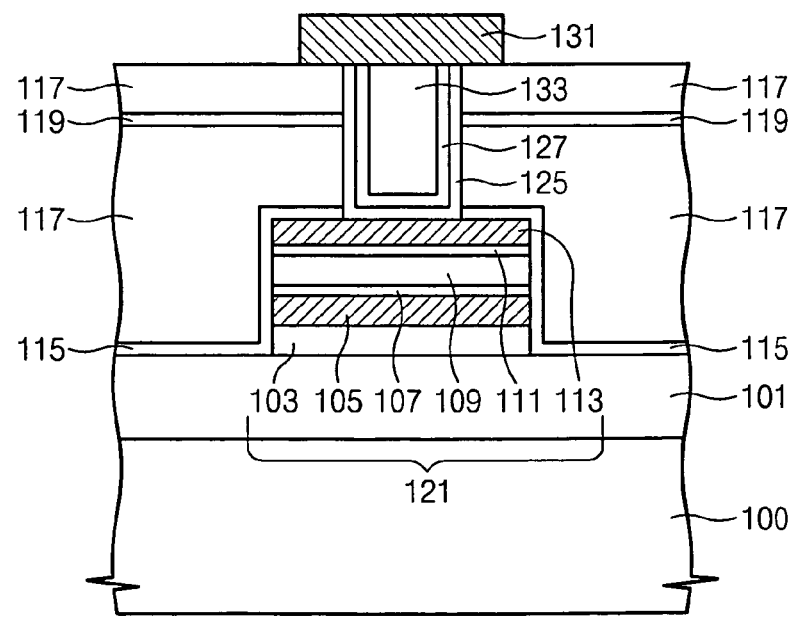

FIG. 5A through FIG. 5C are cross-sectional views of an FeRAM device illustrating a method for manufacturing the FeRAM device according to another embodiment of the present invention. A direct cell contact is formed using the same processes as described with reference to FIG. 2 and FIG. 3.

Referring to FIG. 5A, a strontium ruthenium oxide layer 125 and iridium layer 127 are sequentially formed over the second insulation layer 117 and the exposed top electrode 113. Similar to the above embodiment, the strontium ruthenium oxide layer 125 and the iridium layer 127 may be deposited using, for example, sputtering, CVD or ALD. A dielectric layer such as an oxide 133 is then stacked on the iridium layer 127.

Referring to FIG. 5B, the oxide 133 is removed using chemical mechanical polishing (CMP) or etch-back to be as tall as the iridium layer 127 overlying the second insulation layer 117. The strontium ruthenium oxide layer 125 and the iridium layer 127 overlying the second insulation layer 117 are then removed using, for example, an etch-back process. Although not shown in the figure, the oxide layer 133 may protrude somewhat relative to a top surface of the second insulation layer 117 due to a difference between an etch ratio of the strontium ruthenium oxide layer 125 to the oxide layer 133 and an etch ratio of the iridium layer 127 to the oxide layer 133. Thereafter, the protrusion of the oxide layer 133 may be removed using, for example, an etch-back process. The strontium ruthenium oxide layer 125, the iridium layer 127, and the oxide layer 133 formed on the second insulation layer 117 may also be removed by a CMP process using the second insulation layer 133 as a stopping layer. Referring to FIG. 5C, a metal is deposited on the oxide layer 133 and the second insulation layer 117 and patterned to form a plate line 131. The metal may be aluminum.

Figure 6:
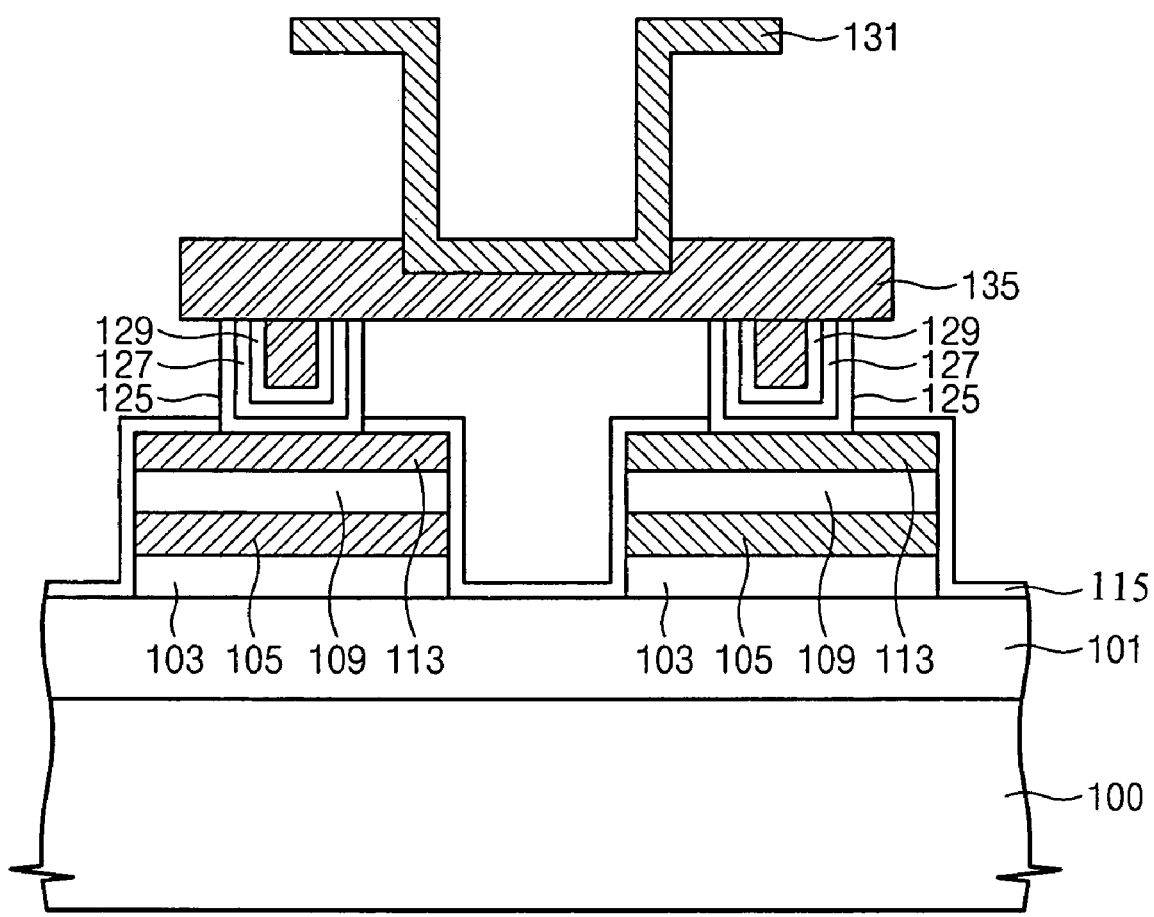
FIG. 6 is a cross-sectional view of an FeRAM device according to another embodiment of the present invention.

FIG. 6 is a cross-sectional view of an FeRAM device according to another embodiment of the present invention. The FeRAM device shown in FIG. 6 includes a top electrode 113 as well as another top electrode 135. A diffusion barrier layer including a strontium ruthenium oxide layer 125 and an iridium layer 127 is formed along a bottom and a sidewall of a top electrode contact interconnecting the top electrodes 113 and 135. A metal diffusion barrier layer 129 may also be formed on the iridium layer 127 as part of the diffusion barrier layer. Thus, characteristics of a ferroelectric layer 109 are not degraded even though nitrogen is produced when the top electrode 135 and a plate electrode 131 are formed after the formation of the top electrode contact. Although not shown in the figure, another strontium ruthenium oxide layer may be further formed between a bottom electrode 105 and the ferroelectric layer 109 and between the ferroelectric layer 109 and the top electrode 113, as previously stated.

That is, in order to prevent materials used in top and bottom electrodes of a ferroelectric capacitor from diffusing into a ferroelectric layer, strontium ruthenium oxide is formed between the top electrode and the ferroelectric layer and between the bottom electrode and the ferroelectric layer. A diffusion barrier layer including strontium ruthenium oxide and iridium is formed at a plate line interconnecting top electrodes of ferroelectric capacitors and in a direct cell contact formed between respective top electrodes of ferroelectric capacitors and a top electrode contact formed between a top electrode and another electrode of a ferroelectric capacitor. Thus, diffusion of nitrogen or metallic materials produced in subsequent processes is suppressed to prevent degradation of the ferroelectric layer. As a result, desired characteristics of an FeRAM are maintained.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Various operations will be described as multiple discrete steps performed in a manner that is most helpful in understanding the invention. However, the order in which the steps are described does not imply that the operations are order-dependent or that the order that steps are performed must be the order in which the steps are presented.

Other modifications and variations to the invention will be apparent to a person skilled in the art from the foregoing disclosure. Thus, while only certain embodiments of the invention has been specifically described herein, it will be apparent that numerous modifications may be made thereto without departing from the spirit and scope of the invention.

What is claimed is:

1. A semiconductor device comprising:
    a ferroelectric capacitor including a bottom electrode, a ferroelectric layer, and a top electrode which are sequentially stacked on a semiconductor substrate;
    an insulation layer formed on the ferroelectric capacitor and including a contact hole exposing a portion of the top electrode of the ferroelectric capacitor;
    a diffusion barrier layer including a strontium ruthenium oxide layer and an iridium layer formed in the contact hole, wherein the strontium ruthenium oxide layer is formed on a portion of the top electrode exposed by the contact hole and the iridium layer is formed on the strontium ruthenium oxide layer; and
    a plug material formed on the iridium layer to fill the contact hole.

2. The device of claim 1, wherein the diffusion barrier layer further comprises a metal diffusion barrier layer.

3. The device of claim 2, wherein the metal diffusion barrier layer formed of a material chosen from titanium nitride, tantalum silicon nitride, and titanium silicon nitride.

4. The device of claim 1, further comprising a shield layer formed on the ferroelectric capacitor.

5. The device of claim 1, further comprising a strontium ruthenium oxide layer stacked between the bottom electrode and the ferroelectric layer.

6. The device of claim 1, further comprising a strontium ruthenium oxide layer stacked between the ferroelectric layer and the top electrode.

7. The device of claim 1, further comprising an iridium oxide layer stacked between the bottom electrode and the ferroelectric layer.

8. The device of claim 1, further comprising an iridium oxide layer stacked between the ferroelectric layer and the top electrode.

9. The device of claim 1, wherein the plug material comprises tungsten.

10. The device of claim 1, wherein the plug material comprises oxide.

11. The device of claim 1, further comprising a second top electrode formed on the insulation layer and plug material.

12. The device of claim 1, further comprising a plate line formed on the insulation layer and connected to the diffusion barrier layer and the plug material.

13. A method for manufacturing a semiconductor device, comprising:
    forming a ferroelectric capacitor including a bottom electrode, a ferroelectric layer, and a top electrode on a semiconductor substrate;
    forming an insulation layer on the ferroelectric capacitor;
    removing the insulation layer to partially expose the top electrode of the ferroelectric capacitor, thereby forming a contact hole;
    forming a diffusion barrier layer including a strontium ruthenium oxide layer and an iridium layer in the contact hole, wherein the strontium ruthenium oxide layer is formed on the exposed top electrode and the iridium layer is formed directly on the strontium ruthenium oxide layer; and
    forming a plug material on the iridium to fill the contact hole.

14. The method of claim 13, wherein the ferroelectric capacitor further comprises a strontium ruthenium oxide layer stacked between the bottom electrode and the ferroelectric layer.

15. The method of claim 13, wherein the ferroelectric capacitor further comprises a strontium ruthenium oxide layer stacked between the ferroelectric layer and the top electrode.

16. The method of claim 13, wherein the ferroelectric capacitor further comprises an iridium oxide layer stacked between the bottom electrode and the ferroelectric layer.

17. The method of claim 13, wherein the ferroelectric capacitor further comprises an iridium oxide layer stacked between the ferroelectric layer and the top electrode.

18. The method of claim 13, which further comprises forming a plate line on the insulation layer, the plate line being connected to the diffusion barrier layer and the plug material.

19. A ferroelectric random access memory (FeRAM) device comprising:
- a first insulation layer formed on a semiconductor substrate;
- a ferroelectric capacitor including a bottom electrode, a first strontium ruthenium oxide layer, a ferroelectric layer, a second strontium ruthenium oxide layer, and a top electrode, formed on the first insulation layer;
- a shield layer formed on the ferroelectric capacitor and the first insulation layer;
- a second insulation layer formed on the shield layer, the shield layer and the second insulation layer having a contact hole extending therethrough to expose a portion of the top electrode of the ferroelectric capacitor;
- a diffusion barrier layer including a strontium ruthenium oxide layer and an iridium layer formed on the exposed portion of the top electrode and sidewalls of the contact hole;
- a plug material formed on the iridium layer to fill the contact hole; and
- a plate line formed on the insulation layer and connected to the diffusion barrier layer and the plug material.

20. The FeRAM device of claim 19, further comprising plugs to connect the bottom electrode to a source/drain region formed in the semiconductor substrate.

* * * * *

UNITED STATES PATENT AND TRADEMARK OFFICE
CERTIFICATE OF CORRECTION

PATENT NO. : 7,294,876 B2 Page 1 of 1
APPLICATION NO. : 11/325633
DATED : November 13, 2007
INVENTOR(S) : Heung-Jin Joo et al.

It is certified that error appears in the above-identified patent and that said Letters Patent is hereby corrected as shown below:

On title page Item [56] Reference #6,674,633, the name "Horii et al." should read -- Sun et al. --;
Column 5, line 63, the word "ferroclectric" should read -- ferroelectric --.

Signed and Sealed this

Thirtieth Day of September, 2008

JON W. DUDAS
*Director of the United States Patent and Trademark Office*